(12) United States Patent
Liehr

(10) Patent No.: US 6,175,183 B1
(45) Date of Patent: Jan. 16, 2001

(54) DEVICE FOR PRODUCING PLASMA

(75) Inventor: Michael Liehr, Feldatal (DE)

(73) Assignee: Leybold Systems GmbH, Hanau (DE)

( * ) Notice: Under 35 U.S.C. 154(b), the term of this patent shall be extended for 0 days.

(21) Appl. No.: 09/315,032

(22) Filed: May 20, 1999

(51) Int. Cl.[7] ................. H01J 1/46; H01J 37/32
(52) U.S. Cl. ..................... 313/231.31; 315/5.38; 315/111.71; 315/111.81
(58) Field of Search .............. 313/231.31, 231.61, 313/359.1, 5.38, 111.31, 111.71, 111.81, 111.41

(56) References Cited

U.S. PATENT DOCUMENTS

| | | | |
|---|---|---|---|
| 4,517,495 | * | 5/1985 | Piepmeier ................. 313/111.41 |
| 4,974,487 | * | 12/1990 | Goldstein et al. ........ 315/111.31 X |
| 5,361,016 | * | 11/1994 | Ohkawa et al. .......... 313/231.31 X |

FOREIGN PATENT DOCUMENTS

| | | |
|---|---|---|
| 4136297 | 5/1993 | (DE) . |
| 195 03 205 | 7/1996 | (DE) . |
| 195 32 435 | 3/1997 | (DE) . |
| 196 28 952 | 1/1998 | (DE) . |
| 196 28 954 | 1/1998 | (DE) . |

* cited by examiner

Primary Examiner—Ashok Patel
(74) Attorney, Agent, or Firm—Smith, Gambrell & Russell, LLP

(57) ABSTRACT

A device for producing plasma in a vacuum chamber (13) with the help of electromagnetic alternating fields, in which a rod-shaped conductor (3) that is inside a pipe (2) and is made of an insulating material and is guided into the vacuum chamber (13). The inner diameter of the insulating pipe (2) is larger than the diameter of the conductor (3). The insulating pipe (2) is held in the wall (1) of the vacuum chamber (13) at one end, and its outer surface is sealed across from the vacuum chamber wall. The conductor (3) is connected to a source (9) for producing the electromagnetic alternating field. A pipe-shaped conductor (4) extends coaxially to the rod-shaped conductor (3) in the annulus formed by the rod-shaped conductor (3) and the insulating pipe (2), whereby the radial inner ring slot (14) formed between the rod-shaped conductor (3) and the pipe-shaped conductor (4) corresponds to the waveguide (10) of the source (9). The radial outer ring slot (15) formed by the insulating pipe (2) and the pipe-shaped conductor (4) is connected to the waveguide (10') of a second source (8).

5 Claims, 1 Drawing Sheet

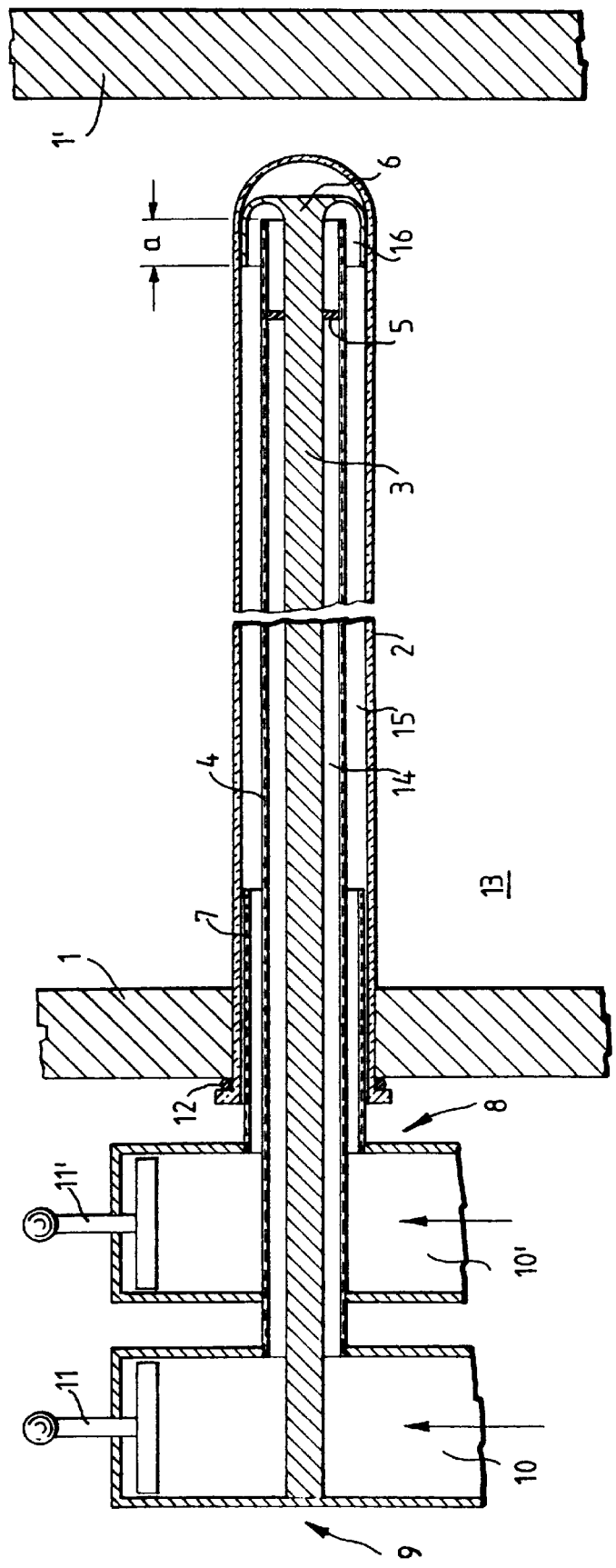

DEVICE FOR PRODUCING PLASMA

INTRODUCTION AND BACKGROUND

The present invention relates to a device for producing plasma in a vacuum chamber with the help of electromagnetic alternating fields, in which a rod-shaped conductor that is inside a pipe and is made of an insulating material is guided into the vacuum chamber wall. More particularly, the inner diameter of the insulating pipe is larger than the diameter of the conductor, and the insulating pipe is held in the wall of the vacuum chamber at one end and its outer surface is sealed across from the vacuum chamber. The conductor is connected to a source for producing the electromagnetic alternating field.

With a known device for producing plasma (DE 195 03 205) it is possible to produce plasma for surface treatments and coating techniques within a limited operating range (process area, gas pressure, microwave output). The known device essentially consists of a cylindrical glass pipe installed in a vacuum chamber and a metallic-conducting pipe is located in it. Atmospheric pressure exists in the inner space of the glass pipe. Microwave output is initiated on both sides by two power supplies and two metallic coaxial transmission lines—which consist of an inner conductor and outer conductor—through the walls of the vacuum process chamber. The absent outer conductor of the coaxial transmission line inside the vacuum process chamber is replaced by a plasma discharge, which is ignited and maintained by the microwave output under sufficient igniting conditions (gas pressure). The microwave output can come out of both metallic coaxial transmission lines and the glass pipe in the vacuum process chamber. The plasma surrounds the cylindrically shaped glass pipe from the outside and forms, together with the inner conductor, a coaxial transmission line with a very high attenuation coefficient.

With a steady microwave output fed on both sides, the gas pressure of the vacuum process chamber can be adjusted in such a way that the plasma visibly burns evenly along the length of the device where the outside conductor of the coaxial transmission line is missing inside the vacuum process chamber.

When the gas pressure in the vacuum process chamber is raised with a preset microwave output, experience indicates that the uniformity of the plasma along the device is, however, lost. The plasma in about half the distance between the power supply points of the device becomes optically weaker and can be completely extinguished beyond a certain pressure. The plasma line "tears apart" and the two resulting plasma portions withdraw in the direction of the power supplies when the pressure is raised further. Especially with long devices (e.g., 1 m or more) this effect leads to irregular plasmas and, as a result, to irregular vacuum processes. The plasma portions display high luminosity at the ends of the power supply near the walls and are weaker towards the middle.

The attenuation of the microwaves does not depend in any way on the position along the coaxial transmission line. Because the dielectric filler of the coaxial transmission line consists of air and the relative dielectric constant of the dielectric of the coaxial transmission line is constant over the length of the device, the magnitude of the attenuation depends only on the penetration depth of the microwave in the conducting surfaces. When the attenuation per unit of length is constant, this means that the net microwave output per unit of length emitted on the plasma is falling along the device toward the middle. Because the outside conductor consists of plasma, the conductivity cannot be exactly determined. Of course it depends on the plasma density and this in turn is, to a limited extent, a function of the microwave power density in the discharge area. It is presumably several magnitudes higher than in the case of metallic surfaces (–50 $\mu$m) and not constant over the length of the device.

Furthermore, it has been shown that the known device is rarely capable of maintaining a plasma discharge at pressures lower than $8 \times 10^2$ mbar. To raise the flexibility of the device it would be desirable to guarantee the operating conditions for a plasma discharge without the support of the magnetic field even at lower pressures.

An object of the present invention therefore is to improve the known device and to enable coating larger, flat, three-dimensional substrates.

It is a further object of the present invention to accomplish this with only one opening in the wall of the vacuum chamber in each case.

SUMMARY OF THE INVENTION

The above and other objects of the present invention can be achieved by extending a ring-shaped conductor coaxially to the rod-shaped conductor in the annulus formed by the rod-shaped conductor and the insulating pipe, whereby the radial inner ring slot formed between the rod-shaped conductor and the pipe-shaped conductor corresponds to the waveguide of the source, and the radial outer annulus formed by the insulating pipe and the rod-shaped conductor is connected to the waveguide of a second source.

BRIEF DESCRIPTION OF DRAWING

The present invention will be further understood with reference to the accompanying drawing which is a schematic cross-section of a device according to the invention.

DETAILED DESCRIPTION OF THE INVENTION

The present invention will now be described in further detail with reference to the accompanying drawing.

According to the invention, the device for producing plasma in a vacuum chamber by electromagnetic alternating fields, comprises a rod-shaped conductor, located inside a pipe which is made of an insulating material, guidable into a vacuum chamber, where an inner diameter of said insulating pipe is larger than the diameter of said conductor, said insulating pipe begin adapted to be held in a wall of a vacuum chamber at one end and an outer surface of said insulating pipe being sealable opposite from said conductor and being connectable to a source for producing electromagnetic alternating field, a pipe-shaped conductor extending coaxially to said rod-shaped conductor in an annulus formed by the rod-shaped conductor and the insulating pipe, a radial inner ring slot being formed between the rod-shaped conductor and the pipe-shaped conductor being connectable to a waveguide of a first source, and radial outer ring slot formed by the insulating pipe and the pipe-shaped conductor being connectable to a waveguide of a second source.

More particularly, the insulating pipe has an end turned away from said first and second source closed by a cap, whose radial outer part lies against a wall of the insulating pipe has a sleeve that extends in the direction of said first and second source into the ring slot by distance (a), forming an outside conductor, whereby the central part of the cap is connected to the rod-shaped conductor or is integral therewith.

In addition, the outer form of the cap has the form of a straight circular cylinder, whose rotation axis extends in the same direction as the longitudinal axis of the rod-shaped conductor, whereby the front of the cap turned toward the first and second source has an annular-shaped groove with a semicircular cross-sectional area, whereby the radial inner part of the face that is enclosed by the groove is connected to the rod-shaped conductor, and the cylindrical shell of the cap lies against the inner wall of the insulating pipe.

It is a feature of the invention that the cap has a cupola-shaped configuration with a part shaped like a spherical segment and a circular cylindrical part connected to it, whereby in the base of the spherical segment a concentrical, torus-shaped notch is cut whose belted sphere borders on the cylindrical inner surface of the ring-shaped part and whose grooved sphere lies against the free end of the inner conductor or is integral therewith, whereby the longitudinal axis of the inner conductor extends in the same direction as the rotational axis of the cap.

The device essentially consists of the insulating pipe 2 (a glass pipe), which is guided through the wall part 1 of the vacuum chamber 13 with a rod-shaped conductor 3 that is positioned coaxially to the insulating pipe and whose one end is firmly connected to the rectangular waveguide 10 of the source 9; a pipe-shaped conductor 4, which extends into the annulus formed by the insulating pipe 2 and the rod-shaped conductor 3; a spacing washer 5, which insures that the annulus 14 is restrained and which is, for example, made of a plastic; a reversing cap 6, which connects the annuluses 14 and 15; a metal casino 7, which is inserted into the insulating pipe 2 and forms an outer conductor; a sealing ring 12 that is inserted between the insulating pipe 2 and the chamber wall 1; the rectangular waveguide 10', which is firmly connected to the metal casing 7, of a source 8; and the adjusting elements 11, 11'.

In the device schematically represented in the drawing, one part of the microwave total output—almost one-half—is fed to the plasma coaxially in the traditional way (through the rectangular waveguide 10' with the aid of the adjusting element 11' from the left through the coaxial transmission line, consisting of 4 and 7), and the rest of the microwave total output—about one-half—is fed from the opposite side through the rectangular waveguide 10 by means of the adjusting element 11, a coaxial bypass, consisting of the inner conductor 3 and the outer conductor 4, an end coaxial reversing device (cap 6) for the conductor waves, and a short coaxial conductor with the inner conductor 4 and the outer conductor 7.

Feeding microwave output to the device need not necessarily be carried out through the rectangular waveguide; it can also take place through other suitable waveguide devices. In addition, microwaves fed to the device through two waveguide devices are not necessarily phase-correlated.

The length of the entire device can be adjusted in each case to the particular end use. For example, in very long designs a plate made of dielectric material with low microwave absorption must be provided to insure stability so that the coaxial conductors 3, 4, and 7 are held in concentric form.

The entire device is located inside a container made of a vacuum-tight, heat-resistant, yet microwave-permeable material (e.g., dry quartz glass, aluminum-oxide ceramic, zirconium-oxide ceramic), whereby atmospheric pressure exits in the device and gas pressure suitable for igniting and maintaining a plasma discharge exists outside the insulating pipe 2. The insulating pipe 2 is guided through the wall 1 of a vacuum container (e.g., plasma process reactor) 13 at only one place and is connected vacuum-tight to it.

The device described herein has the following advantages:
the same efficiency as a device that is fed and attached on two sides, but has the advantage of one-sided feeding and attachment;
maintenance of a very small cross-sectional area of the entire device, even with very long constructions (e.g., a dielectric container with a 30-mm diameter given a length of 2,000 mm);
ideal for the use/retrofitting in coil-coating machinery.

Further variations and modifications will be apparent to those skilled in the art from the foregoing and are intended to the encompassed by the claims appended hereto.

German priority application 198 25 125.4 is relied on and incorporated herein by reference.

What is claimed is:

1. A device for producing plasma in a vacuum chamber by electromagnetic alternating fields, comprising a rod-shaped conductor, located inside a pipe which is made of an insulating material, guidable into a vacuum chamber, where an inner diameter of said insulating pipe is larger than the diameter of said conductor, said insulating pipe being adapted to be held in a wall of a vacuum chamber at one end and an outer surface of said insulating pipe being sealable opposite from said conductor and being connectable to a source for producing electromagnetic alternating field, a pipe-shaped conductor extending coaxially to said rod-shaped conductor in a annulus formed by the rod-shaped conductor and the insulating pipe, a radial inner ring slot being formed between the rod-shaped conductor and the pipe-shaped conductor being connectable to a waveguide of a first source, and radial outer ring slot formed by the insulating pipe and the pipe-shaped conductor being connectable to a waveguide of a second source.

2. The device according to claim 1, further comprising said insulating pipe having an end turned away from said first and second source closed by a cap, whose radial outer part lying against a wall of the insulating pipe has a sleeve that extends in the direction of said first and second source into the ring slot by distance (a), forming an outside conductor, whereby the central part of the cap is firmly connected to the rod-shaped conductor or is integral therewith.

3. The device according to claim 1, further comprising that the outer form of the cap has the form of a straight circular cylinder, whose rotation axis extends in the same direction as the longitudinal axis of the rod-shaped conductor, whereby the front of the cap turned toward the first and second source has an annular-shaped groove with a semicircular cross-sectional area, whereby the radial inner part of the face that is enclosed by the groove is connected to the rod-shaped conductor, and the cylindrical shell of the cap lies against the inner wall of the insulating pipe.

4. The device according to claim 2, further comprising that the cap has a cupola-shaped configuration with a part shaped like a spherical segment and a circular cylindrical part connected to it, whereby in the base of the spherical segment a concentrical, torus-shaped notch is cut whose belted sphere borders on the cylindrical inner surface of the ring-shaped part and whose grooved sphere lies against the free end of the inner conductor or is integral therewith, whereby the longitudinal axis of the inner conductor extends in the same direction as the rotational axis of the cap.

5. A vacuum chamber for creating a plasma having fitted in a wall thereof the device of claim 1.

* * * * *